United States Patent
Jung et al.

(10) Patent No.: US 10,477,082 B2
(45) Date of Patent: Nov. 12, 2019

(54) CAMERA ASSEMBLY AND ELECTRONIC DEVICE INCLUDING THE SAME

(71) Applicant: Samsung Electronics Co., Suwon-si (KR)

(72) Inventors: Hyun-Tae Jung, Gumi-si (KR); Seung-Hun Shin, Gumi-si (KR); Chang-Ho Hwang, Tongyeong-si (KR); Min-Soo Kim, Gumi-si (KR); Sang-Tae Lee, Gumi-si (KR); Ji-Hyuk Jang, Gumi-si (KR); Jin-Wan An, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/053,682

(22) Filed: Aug. 2, 2018

(65) Prior Publication Data
US 2019/0058814 A1 Feb. 21, 2019

(30) Foreign Application Priority Data
Aug. 21, 2017 (KR) .......... 10-2017-0105601

(51) Int. Cl.
*H04N 5/225* (2006.01)
*H05K 9/00* (2006.01)
(Continued)

(52) U.S. Cl.
CPC ....... *H04N 5/2252* (2013.01); *H04N 5/22521* (2018.08); *H05K 1/181* (2013.01);
(Continued)

(58) Field of Classification Search
CPC ............ H04N 5/2252; H04N 5/22521; H04N 5/2253; H04N 5/2254; H04N 5/23287;
(Continued)

(56) References Cited

U.S. PATENT DOCUMENTS

| 2005/0270405 A1 | 12/2005 | Tanida et al. |
| 2011/0130177 A1 | 6/2011 | Halliday |

(Continued)

FOREIGN PATENT DOCUMENTS

KR 10-2012-0059184 A 6/2012

OTHER PUBLICATIONS

ISA/KR, "International Search Report and Written Opinion of the International Searching Authority," International Application No. PCT/KR2018/006825, dated Nov. 7, 2018, 9 pages.

*Primary Examiner* — Shahbaz Nazrul

(57) ABSTRACT

An electronic device is provided. The electronic device includes a housing including a front plate, a back plate, and a side member surrounding a space between the front plate and the back plate. The side member includes a plurality of non-conductive portions and a conductive portion. The electronic device also includes a display module, and at least one wireless communication circuit. The electronic device also includes a printed circuit board (PCB). The camera assembly is exposed through a portion of the back plate. The camera assembly includes an image sensor mounted on the PCB, and a plurality of lenses. The camera assembly also includes a barrel that surrounds the plurality of lenses, and a camera bracket that surrounds at least part of the barrel. The camera assembly also includes a metal case that surrounds at least part of the camera assembly, and a shielding structure.

20 Claims, 11 Drawing Sheets

(51) Int. Cl.
*H05K 7/14* (2006.01)
*H05K 1/18* (2006.01)
*H04N 5/232* (2006.01)

(52) U.S. Cl.
CPC ......... *H05K 7/1427* (2013.01); *H05K 9/0024* (2013.01); *H05K 9/0049* (2013.01); *H04N 5/2253* (2013.01); *H04N 5/2254* (2013.01); *H04N 5/23287* (2013.01); *H05K 2201/10121* (2013.01); *H05K 2201/10151* (2013.01)

(58) Field of Classification Search
CPC .. H05K 9/0024; H05K 7/1427; H05K 9/0049; H05K 1/181; H05K 2201/10121; H05K 2201/10151
See application file for complete search history.

(56) References Cited

U.S. PATENT DOCUMENTS

| | | | |
|---|---|---|---|
| 2014/0043519 A1 | 2/2014 | Azuma et al. | |
| 2017/0108705 A1* | 4/2017 | Yu | G02B 7/09 |
| 2017/0142823 A1* | 5/2017 | Shim | H04M 1/0277 |
| 2017/0172005 A1* | 6/2017 | Kim | H05K 5/0017 |
| 2017/0207516 A1* | 7/2017 | Koo | H01Q 1/44 |
| 2017/0214132 A1 | 7/2017 | Jeon | |
| 2018/0017999 A1* | 1/2018 | Kim | G06F 1/1601 |
| 2018/0091712 A1* | 3/2018 | Lee | G01J 3/0208 |
| 2018/0366812 A1* | 12/2018 | Kim | H01Q 1/44 |
| 2019/0042045 A1* | 2/2019 | Lee | G06F 3/0414 |
| 2019/0173987 A1* | 6/2019 | Sung | G06F 1/1658 |

* cited by examiner

CAMERA ASSEMBLY AND ELECTRONIC DEVICE INCLUDING THE SAME

CROSS-REFERENCE TO RELATED APPLICATIONS AND CLAIM OF PRIORITY

This application is based on and claims priority under 35 U.S.C. § 119 to Korean Patent Application No. 10-2017-0105601 filed on Aug. 21, 2017, in the Korean Intellectual Property Office, the disclosure of which is incorporated by reference herein in its entirety.

BACKGROUND

1. Field

The disclosure relates generally to camera assemblies equipped in electronic devices and camera assemblies for preventing, e.g., radio wave noise.

2. Description of the Related Art

The term "electronic device" may mean a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling or e-wallet function.

Electronic devices may come with a camera assembly. As camera assemblies are equipped in portable electronic devices, research efforts to implement more compact and capable cameras continue. Autofocusing and image stabilizing features are among techniques for enhancing the performance of camera assemblies.

As camera assemblies become more compact, electronic parts to perform various functions are being integrated. The electronic parts in a camera assembly may radiate electromagnetic waves that may disturb normal operations of electronic parts arranged inside or outside the camera assembly. For example, electromagnetic emissions from the printed circuit board to control the camera assembly and/or image sensor may deteriorate the performance—particularly radio frequency (RF) performance—of the ambient electronic parts. Further, the use of a dual-camera assembly may weaken the ground structure due to an increase in the size of the camera assembly on the printed circuit board.

The above information is presented as background information only to assist with an understanding of the present disclosure. No determination has been made, and no assertion is made, as to whether any of the above might be applicable as prior art with regard to the present disclosure.

SUMMARY

According to various embodiments of the present disclosure, there are provided a camera assembly that may shield embodiment waves emitted from the image sensor or the printed circuit board to control the camera assembly and an electronic device including the camera assembly.

According to an embodiment of the present disclosure, an electronic device may comprise a housing including a front plate, a back plate facing the front plate, and a side member surrounding a space between the front plate and the back plate, the side member including a plurality of non-conductive portions and a conductive portion inserted in contact between the non-conductive portions along at least a portion of a side surface of the side member, a display module exposed through the front plate, at least one wireless communication circuit electrically connected with the conductive portion, a printed circuit board (PCB) positioned between the display module and the back plate and a camera assembly mounted on the PCB such that the camera assembly is interposed between the PCB and the back plate while exposed through a portion of the back plate.

The camera assembly includes an image sensor mounted on the PCB, a plurality of lenses stacked over one another between the image sensor and the portion of the back plate, a barrel positioned between the PCB and the back plate while laterally surrounding the plurality of lenses, a camera bracket positioned between the PCB and the back plate while laterally surrounding at least part of the barrel, a metal case positioned between the PCB and the back plate while laterally surrounding at least part of the camera housing and a shielding structure interposed between the camera bracket and the metal case while being spaced from the metal case.

According to an embodiment of the present disclosure, an electronic device may include a camera assembly. The camera assembly may face to the rear of the electronic device. The camera assembly may comprise an image sensor disposed on a printed circuit board, a lens module exposed through an opening formed in a rear surface of the electronic device and including a plurality of lenses, a camera bracket at least partially surrounding a side surface of the lens module and configured to protect the lens module, a flexible circuit board at least partially surrounding an outer surface of the camera bracket and contacting the printed circuit board, a metal case at least partially surrounding an outer surface of the lens module and the camera bracket and configured to shield off an electromagnetic wave radiated from an inside of the camera assembly, and a shielding structure disposed between the flexible circuit board and the metal case and spaced apart from a side surface of the metal case.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
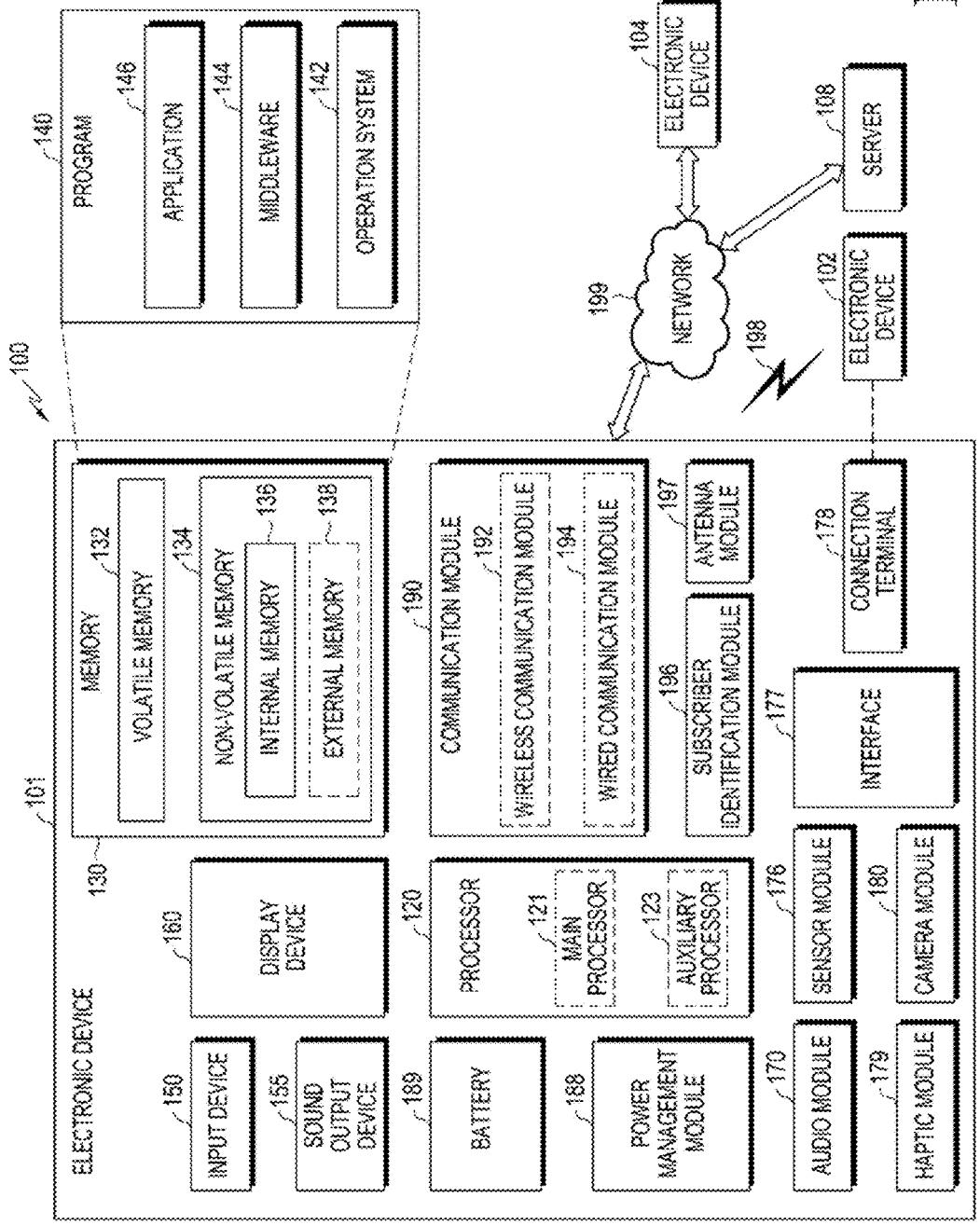
FIG. 1 illustrates a block diagram of an electronic device in a network environment according to an embodiment of the present disclosure.

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The electronic device according to various embodiments may be one of various types of electronic devices. The electronic devices may include at least one of, e.g., a portable communication device (e.g., a smartphone), a computer device, a portable multimedia device, a portable medical device, a camera, a wearable device, or a home appliance. According to an embodiment of the present disclosure, the electronic device is not limited to the above-listed embodiments.

It should be appreciated that various embodiments of the present disclosure and the terms used therein are not intended to limit the techniques set forth herein to particular embodiments and that various changes, equivalents, and/or replacements therefor also fall within the scope of the present disclosure. The same or similar reference denotations may be used to refer to the same or similar elements throughout the specification and the drawings. It is to be understood that the singular forms "a," "an," and "the" include plural references unless the context clearly dictates otherwise. As used herein, the term "A or B," "at least one of A and/or B," "A, B, or C," or "at least one of A, B, and/or C" may include all possible combinations of the enumerated items. As used herein, the terms "1st" or "first" and "2nd" or "second" may modify corresponding components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the term "module" includes a unit configured in hardware, software, or firmware and may interchangeably be used with other terms, e.g., "logic," "logic block," "part," or "circuit." A module may be a single integral part or a minimum unit or part for performing one or more functions. For example, the module may be configured in an application-specific integrated circuit (ASIC).

Various embodiments as set forth herein may be implemented as software (e.g., the program 140) containing commands that are stored in a machine (e.g., computer)-readable storage medium (e.g., an internal memory 136) or an external memory 138. The machine may be a device that may invoke a command stored in the storage medium and may be operated as per the invoked command. The machine may include an electronic device (e.g., the electronic device 101) according to embodiments disclosed herein. When the command is executed by a processor (e.g., the processor 120), the processor may perform a function corresponding to the command on its own or using other components under the control of the processor. The command may contain a code that is generated or executed by a compiler or an interpreter. The machine-readable storage medium may be provided in the form of a non-transitory storage medium. Here, the term "non-transitory" simply means that the storage medium does not include a signal and is tangible, but this term does not differentiate between where data is semi-permanently stored in the storage medium and where data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., a compact disc read only memory (CD-ROM)) or online through an application store (e.g., PLAY-STORE). When distributed online, at least part of the computer program product may be temporarily generated or at least temporarily stored in a storage medium, such as the manufacturer's server, a server of the application store, or a relay server.

According to various embodiments, each component (e.g., a module or program) may be configured of a single or multiple entities, and the various embodiments may exclude some of the above-described sub components or add other sub components. Alternatively or additionally, some components (e.g., modules or programs) may be integrated into a single entity that may then perform the respective (pre-integration) functions of the components in the same or similar manner. According to various embodiments, operations performed by modules, programs, or other components may be carried out sequentially, in parallel, repeatedly, or heuristically, or at least some operations may be executed in a different order or omitted, or other operations may be added. Hereinafter, electronic devices are described with reference to the accompanying drawings, according to various embodiments of the present disclosure. As used herein, the term "user" may denote a human or another device (e.g., an artificial intelligent electronic device) using the electronic device.

FIG. 1 illustrates a block diagram of an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera assembly 180, a power management module 188, a battery 189, a communication module 190, a subscriber identification module (SIM) 196, or an antenna module 197. In some embodiments, the electronic device 101 may exclude at least one (e.g., the display device #160 or the camera assembly 180) of the components or add other components. In some embodiments, some components may be implemented to be integrated together, e.g., as if the sensor module 176 (e.g., a fingerprint sensor, an iris sensor, or an illuminance sensor) is embedded in the display device (160) (e.g., a display).

The processor 120 may drive, e.g., software (e.g., a program 140) to control at least one other component (e.g., a hardware or software component) of the electronic device 101 connected with the processor 120 and may process or compute various data. The processor 120 may load and process a command or data received from another component (e.g., the sensor module 176 or the communication module 190) on a volatile memory 132, and the processor 120 may store resultant data in a non-volatile memory 134. According to an embodiment, the processor 120 may include a main processor 121 (e.g., a central processing unit (CPU) or an application processor), and additionally or alternatively, an auxiliary processor 123 (e.g., a graphics processing unit (GPU), an image signal processor, a sensor hub processor, or a communication processor) that is operated independently from the main processor 121 and that consumes less power than the main processor 121 or is specified for a designated function. Here, the auxiliary processor 123 may be operated separately from or embedded in the main processor 121.

In such case, the auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., performing an application). According to an embodiment, the auxiliary processor 123 (e.g., an image signal processor or a communication processor) may be implemented as part of another component (e.g., the camera assembly 180 or the communication module 190) functionally related to the auxiliary processor 123. The memory 130 may store various data used by at least one component (e.g., the processor 120) of the electronic device 101, e.g., software (e.g., the program 140) and input data or output data for a command related to the software. The memory 130 may include the volatile memory 132 or the non-volatile memory 134.

The program 140, as software stored in the memory 130, may include, e.g., an operating system (OS) 142, middleware 144, or an application 146.

The input device 150 may be a device for receiving a command or data, which is to be used for a component (e.g., the processor 120) of the electronic device 101, from an outside (e.g., a user) of the electronic device 101. The input device 150 may include, e.g., a microphone, a mouse, or a keyboard.

The sound output device 155 may be a device for outputting sound signals to the outside of the electronic device 101. The sound output device 155 may include, e.g., a speaker which is used for general purposes, such as playing multimedia or recording and playing, and a receiver used for call receiving purposes only. According to an embodiment, the receiver may be formed integrally or separately from the speaker.

The display device 160 may be a device for visually providing information to a user of the electronic device 101. The display device 160 may include, e.g., a display, a hologram device, or a projector and a control circuit for controlling the display, hologram device, or projector. According to an embodiment, the display device 160 may include touch circuitry or a pressure sensor capable of measuring the strength of a pressure for a touch.

The audio module 170 may convert a sound into an electrical signal and vice versa. According to an embodiment, the audio module 170 may obtain a sound through the input device 150 or output a sound through the sound output device 155 or an external electronic device (e.g., an electronic device 102 (e.g., a speaker or a headphone) wiredly or wirelessly connected with the electronic device 101.

The sensor module 176 may generate an electrical signal or data value corresponding to an internal operating state (e.g., power or temperature) or external environmental state of the electronic device 101. The sensor module 176 may include, e.g., a gesture sensor, a gyro sensor, an atmospheric pressure sensor, a magnetic sensor, an acceleration sensor, a grip sensor, a proximity sensor, a color sensor, an infrared (IR) sensor, a bio sensor, a temperature sensor, a humidity sensor, or an illuminance sensor.

The interface 177 may support a designated protocol enabling a wired or wireless connection with an external electronic device (e.g., the electronic device 102). According to an embodiment, the interface 177 may include a high definition multimedia interface (HDMI), a universal serial bus (USB) interface, a secure digital (SD) card interface, or an audio interface.

A connecting terminal 178 may include a connector, e.g., an HDMI connector, a USB connector, an SD card connector, or an audio connector (e.g., a headphone connector), which is able to physically connect the electronic device 101 with an external electronic device (e.g., the electronic device 102).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, e.g., a motor, a piezoelectric element, or an electric stimulator.

The camera assembly 180 may capture a still image or moving images. According to an embodiment, the camera assembly 180 may include one or more lenses, an image sensor, an image signal processor, or a flash.

The power management module 188 may be a module for managing power supplied to the electronic device 101. The power management module 188 may be configured as at least part of, e.g., a power management integrated circuit (PMIC).

The battery 189 may be a device for supplying power to at least one component of the electronic device 101. The battery 189 may include, e.g., a primary cell which is not rechargeable, a secondary cell which is rechargeable, or a fuel cell.

The communication module 190 may support establishing a wired or wireless communication channel between the electronic device 101 and an external electronic device (e.g., the electronic device 102, the electronic device 104, or the server 108) and performing communication through the established communication channel. The communication module 190 may include one or more communication processors that are operated independently from the processor 120 (e.g., an application processor) and supports wired or wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of the wireless communication module 192 and the wired communication module 194 may be used to communicate with an external electronic device through a first network 198 (e.g., a short-range communication network, such as bluetooth, wireless-fidelity (Wi-Fi) direct, or infrared data association (IrDA)) or a second network 199 (e.g., a long-range communication network, such as a cellular network, the Internet, or a communication network (e.g., LAN or wide area network (WAN)). The above-enumerated types of communication modules 190 may be implemented in a single chip or individually in separate chips.

According to an embodiment, the wireless communication module 192 may differentiate and authenticate the electronic device 101 in the communication network using user information stored in the subscriber identification module 196.

The antenna module 197 may include one or more antennas for transmitting or receiving a signal or power to/from an outside. According to an embodiment, the communication module 190 (e.g., the wireless communication module 192) may transmit or receive a signal to/from an external electronic device through an antenna appropriate for a communication scheme.

Some of the above-described components may be connected together through an inter-peripheral communication scheme (e.g., a bus, general purpose input/output (GPIO), serial peripheral interface (SPI), or mobile industry processor interface (MIPI)), communicating signals (e.g., commands or data) therebetween.

According to an embodiment, commands or data may be transmitted or received between the electronic device 101 and the external electronic device 104 via the server 108 coupled with the second network 199. The first and second external electronic devices 102 and 104 each may be a device of the same or a different type from the electronic device 101. According to an embodiment, all or some of operations executed on the electronic device 101 may be run on one or more other external electronic devices. According to an embodiment, when the electronic device 101 should perform a certain function or service automatically or at a request, the electronic device 101, instead of, or in addition to, executing the function or service on its own, may request an external electronic device to perform at least some functions associated therewith. The external electronic device receiving the request may execute the requested functions or additional functions and transfer a result of the execution to the electronic device 101. The electronic device 101 may provide a requested function or service by processing the received result as it is or additionally. To that end, a cloud computing, distributed computing, or client-server computing technique may be used, for example.

Figure 2:
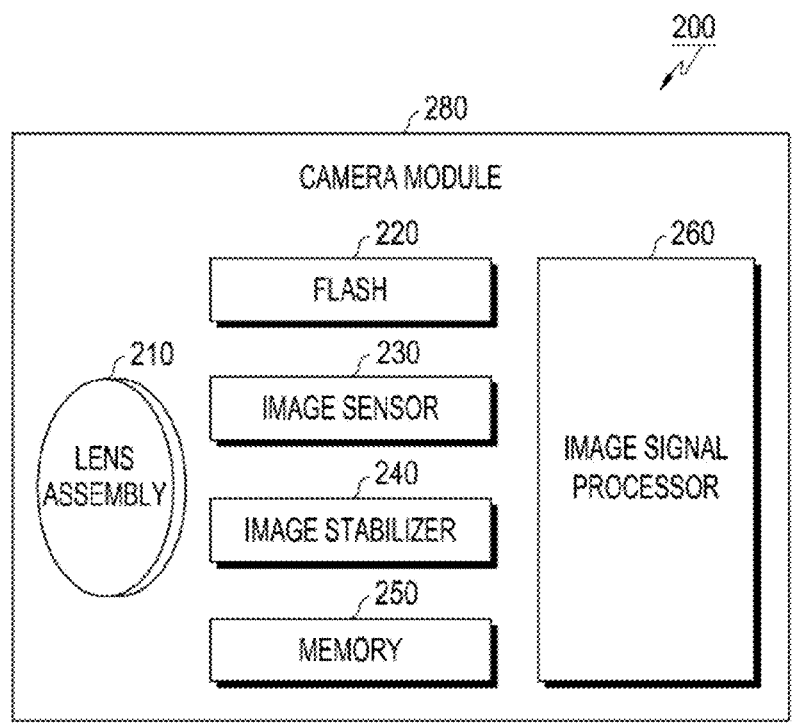
FIG. 2 illustrates a block diagram of a camera assembly according to an embodiment of the present disclosure.

FIG. 2 illustrates a block diagram of a camera assembly 180 according to an embodiment of the present disclosure. The camera assembly 280 of FIG. 2 may wholly or partially have the same configuration as the camera assembly 180 of FIG. 1.

Referring to FIG. 2, the camera assembly 280 may include a lens assembly 210, a flash 220, an image sensor 230, an image stabilizer 240, memory 250 (e.g., buffer memory), or an image signal processor 260.

According to an embodiment of the present disclosure, the lens assembly 210 may collect light emitted or reflected from an object whose image is to be taken. The lens assembly 210 may include one or more lenses. According to an embodiment, the camera assembly 280 may include a plurality of lens assemblies 210. In this case, the camera assembly 280 may be, e.g., a dual camera, a 360-degree camera, or a spherical camera. The plurality of lens assemblies 210 may have the same lens attribute (e.g., view angle, focal length, auto-focusing, f number, or optical zoom), or at least one lens assembly may have at least one different lens attribute from another lens assembly. The lens assembly 210 may include, for example, a wide-angle lens or a telephoto lens. The flash 220 may emit light that is used to reinforce light from an object. The flash 220 may include one or more light emitting diodes (LEDs) (e.g., a red-green-blue (RGB) LED, a white LED, an infrared (IR) LED, or an ultraviolet (UV) LED) or a xenon lamp.

According to an embodiment of the present disclosure, the image sensor 230 may obtain an image corresponding to an object by converting light transmitted through the lens assembly 210 into an electrical signal. According to an embodiment, the image sensor 230 may include one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor in the image sensor 230 may be implemented as, e.g., a charge-coupled device (CCD) sensor or a complementary metal-oxide-semiconductor (CMOS) sensor.

According to an embodiment of the present disclosure, the image stabilizer 240 may move in a particular direction, or control (e.g., adjust the read-out timing of), the image sensor 230 or at least one lens included in the lens assembly 210 to at least partially compensate for a negative effect (e.g., image blurring) on a captured image, which is caused by a movement of the camera assembly 280 or the electronic device 101 including the camera assembly 280, in response to the movement. According to an embodiment, the image stabilizer 240 may be implemented as, e.g., an optical image stabilizer. The image stabilizer 240 may sense such movement using a gyro sensor (not shown) or an acceleration sensor (not shown) disposed inside or outside the camera assembly 280.

According to an embodiment of the present disclosure, the memory 250 may store, at least temporarily, at least part of an image obtained via the image sensor 230 for a subsequent image processing task. For example, when image capturing is delayed due to shutter lag or multiple images are quickly captured, a raw image obtained (e.g., a high-resolution image) may be stored in the memory 250, and its corresponding copy (e.g., a low-resolution image) may be previewed through the display device 160. Thereafter, if a specified condition is met (e.g., by a user's input or system command), at least part of the raw image stored in the memory 250 may be obtained and processed, for example, by the image signal processor 260. According to an embodiment, the memory 250 may be configured as at least part of the memory 130 or as a separate memory that is operated independently from the memory 130.

According to an embodiment of the present disclosure, the image signal processor 260 may perform image processing (e.g., depth map generation, three-dimensional (3D) modeling, panorama generation, feature point extraction, image mixing, or image compensation (e.g., noise canceling, resolution adjustment, brightness adjustment, blurring, sharpening, or softening)) on an image obtained through the image sensor 230 or an image stored in the memory 250. Additionally or alternatively, the image signal processor 260 may perform control (e.g., exposure time control or read-out timing control) with respect to at least one (e.g., the image sensor 230) of the components included in the camera assembly 280. An image processed by the image signal processor 260 may be stored back in the memory 250 for further processing, or may be transferred to an external component (e.g., the memory 130, the display device 160, the electronic device 102, the electronic device 104, or the server 108) outside the camera assembly 280. According to an embodiment, the image signal processor 260 may be configured as at least part of the processor 120, or as a separate processor that is operated independently from the processor 120. When the image signal processor 260 is configured as a separate processor, images processed by the image signal processor 260 may be displayed through the display device 160 as they are or after further processed by the processor 120.

According to an embodiment, the electronic device 101 may include two or more camera assemblies 280 with different attributes or functions. In this case, at least one of the camera assembly 280 may be, e.g., a wide-angle camera or a front camera while at least one other camera assembly may be a telephoto camera or a rear camera.

Figure 3:
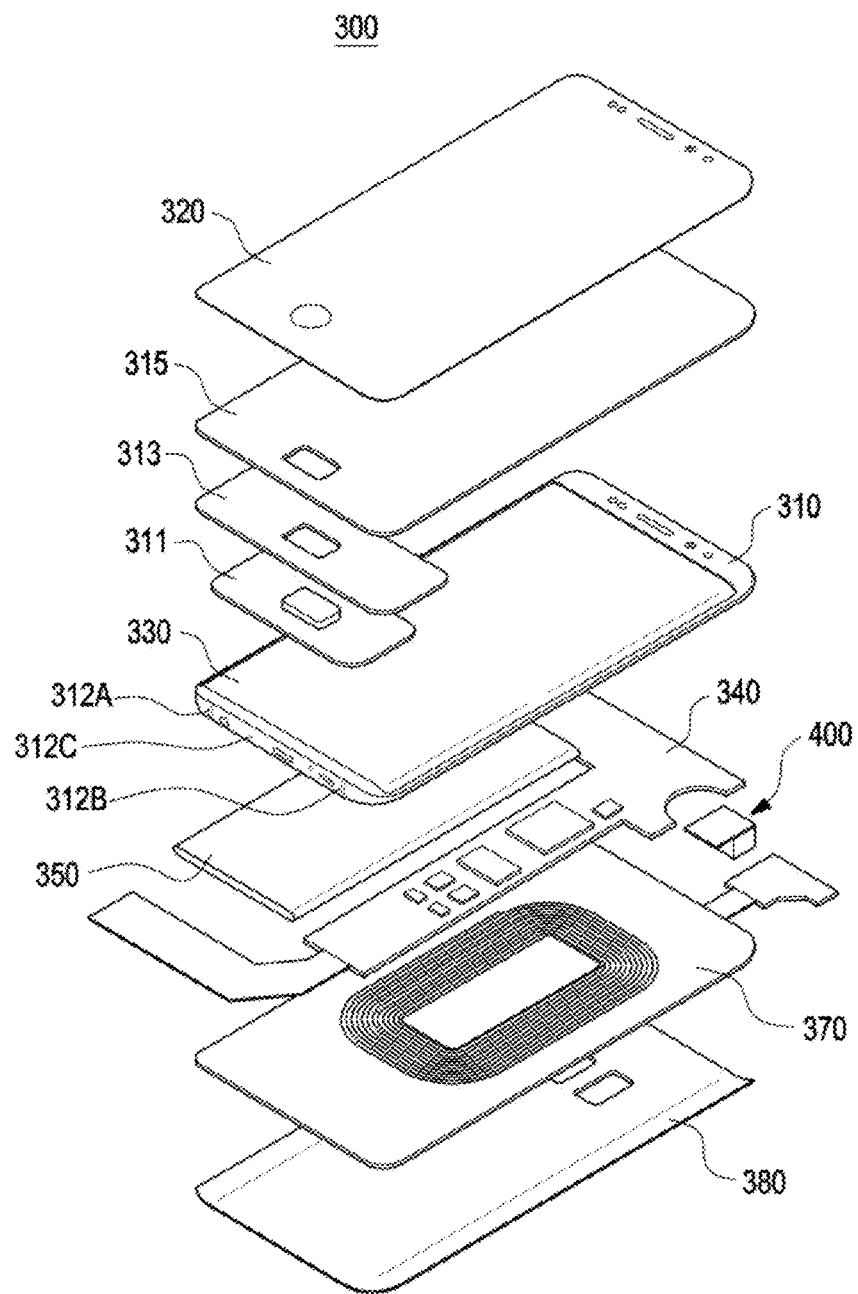
FIG. 3 illustrates an exploded perspective view of an electronic device according to an embodiment of the present disclosure.

FIG. 3 illustrates an exploded perspective view of an electronic device 300 according to an embodiment of the present disclosure. The electronic device 300 of FIG. 3 may wholly or partially have the same configuration as the electronic device 101 of FIG. 1.

Referring to FIG. 3, according to an embodiment of the present disclosure, an electronic device 300 may include a housing, a display module 320, a wireless communication circuit (e.g., the communication module 190 of FIG. 1), a printed circuit board 340, a battery 350, an antenna panel 370, and a camera assembly 400.

According to an embodiment of the present disclosure, the housing may include a front plate (e.g., a window cover of the display module), a back plate (e.g., a rear cover) facing the front plate, and a side member (e.g., a side bezel structure 310 and a supporting member 330 (e.g., a bracket)) surrounding the space between the front plate and the second plate.

According to an embodiment of the present disclosure, the side bezel structure 310 and the supporting member 330 form a body of the electronic device 300. For example, the supporting member 330 may be disposed inside the electronic device 300 and coupled with the side bezel structure 310, or the supporting member 330 may be integrally formed with the side bezel structure 310.

According to an embodiment of the present disclosure, the supporting member 330 may be formed of, e.g., a metal and/or a non-metallic material (e.g., polymer). The display module 320 may be joined onto one surface of the supporting member 330 and the printed circuit board 340 may be joined onto the opposite surface of the supporting member 330. A processor (e.g., the processor 120 of FIG. 1), a memory (e.g., the memory 130 of FIG. 1), and/or an interface (e.g., the interface 177 of FIG. 1) may be mounted on the printed circuit board 340. The processor may include one or more of, e.g., a central processing unit, an application processor, a graphic processing device, an image signal processing, a sensor hub processor, or a communication processor.

According to an embodiment of the present disclosure, the side bezel structure 310 of the housing may have a rectangular shape with four side surfaces and may, at least partially, be formed of a conductive material. For example, the side bezel structure 310 may include a plurality of non-conductive portions 312A and 312B and a conductive portion 312C disposed in contact between the non-conductive portions along at least one of the side surfaces. At least a portion of the conductive portion 312C of the side bezel structure 310 may be utilized as an antenna device, e.g., a radiating conductor. As another example, a portion of the side bezel structure 310 may be insulated from other portions of the supporting member 330 and may electrically be connected with the communication module to be utilized as an antenna device.

According to an embodiment of the present disclosure, the supporting member 330 may form a battery space for receiving the battery 350. The battery 350 may be received in the battery space and may be disposed parallel to, but not overlapping, the printed circuit board 340. The battery 350 may electrically be connected with the printed circuit board 340.

According to an embodiment of the present disclosure, the battery 350 may be a device for supplying power to at least one component of the electronic device 300. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrated or detachably disposed inside the electronic device 300.

According to an embodiment of the present disclosure, the display module 320 may be supported by the side bezel structure 310 and the supporting member 330. The display module 320 may be disposed opposite the printed circuit board 340, with the supporting member 330 interposed therebetween. Where the supporting member 330 is formed of a conductive material, electromagnetic waves radiated as the display module 320 operates may be shielded off by the conductive supporting member 330 and may thus be prevented from entering the printed circuit board 340. Electromagnetic waves produced as the printed circuit board 340 operates may be shielded off by the conductive supporting member 330 and may thus be prevented from coming into the display module 320.

According to an embodiment of the present disclosure, a front cover (not shown) may be attached onto one surface of the display module 320. The front cover may be formed of glass or a transparent reinforced resin. According to an embodiment of the present disclosure, the front cover is not limited as being formed of glass or a reinforced resin and may rather be formed of other various transparent and rigid materials. Images output from the display module may form on the front cover.

According to an embodiment of the present disclosure, the display module 320 may be combined or disposed adjacent to a fingerprint sensing panel 311, a pressure sensor panel 313 capable of measuring the strength (or pressure) of touch, and/or a digitizer panel 315 for detecting a magnetic field-type stylus pen.

According to an embodiment of the present disclosure, the camera assembly 400 may be exposed to the outside through at least one hole formed in the electronic device 300 and may electrically be connected with the printed circuit board 340. For example, the camera assembly 400 may include a front camera device disposed to be exposed through the front cover of the electronic device 300, a rear camera device disposed to be exposed through the rear cover, and/or a flash. The camera assembly 400 may include one or more lenses, an image sensor, and/or an image signal processor as described above in connection with FIG. 2. For example, the flash may include a light emitting diode (LED) or a xenon lamp. The camera assembly 400 is described below in greater detail.

According to an embodiment of the present disclosure, the antenna panel 370 may be disposed between the rear cover 380 and the battery 350. The antenna panel 370 may include, e.g., a near-field communication (NFC) antenna, a wireless charging antenna, and/or a magnetic secure transmission (MST) antenna. The antenna panel 370 may perform short-range communication with, e.g., an external device or may wirelessly transmit or receive power necessary for charging. According to an embodiment of the present disclosure, an antenna structure may be formed by a portion or combination of the side bezel structure 310 and/or the supporting member 330.

According to an embodiment of the present disclosure, the rear cover 380 may be mounted on the rear surface of the supporting member 330 while surrounding, e.g., the printed circuit board 340 and the battery 350, and the rear cover 380, together with the side bezel structure 310 and the front cover of the display module, may form the outer appearance of the electronic device 300. According to an embodiment of the present disclosure, the rear cover 380 may detachably be combined with the supporting member 330, and the user may exchange storage media (e.g., a subscriber identification module (SIM card) or secure digital (SD) card) or batteries 350, with the rear cover 380 removed. As another example, the rear cover 380 and the supporting member 330 may be formed in a uni-body structure, restricting the user from arbitrarily removing the rear cover 380 from the supporting member 330.

Figure 4:
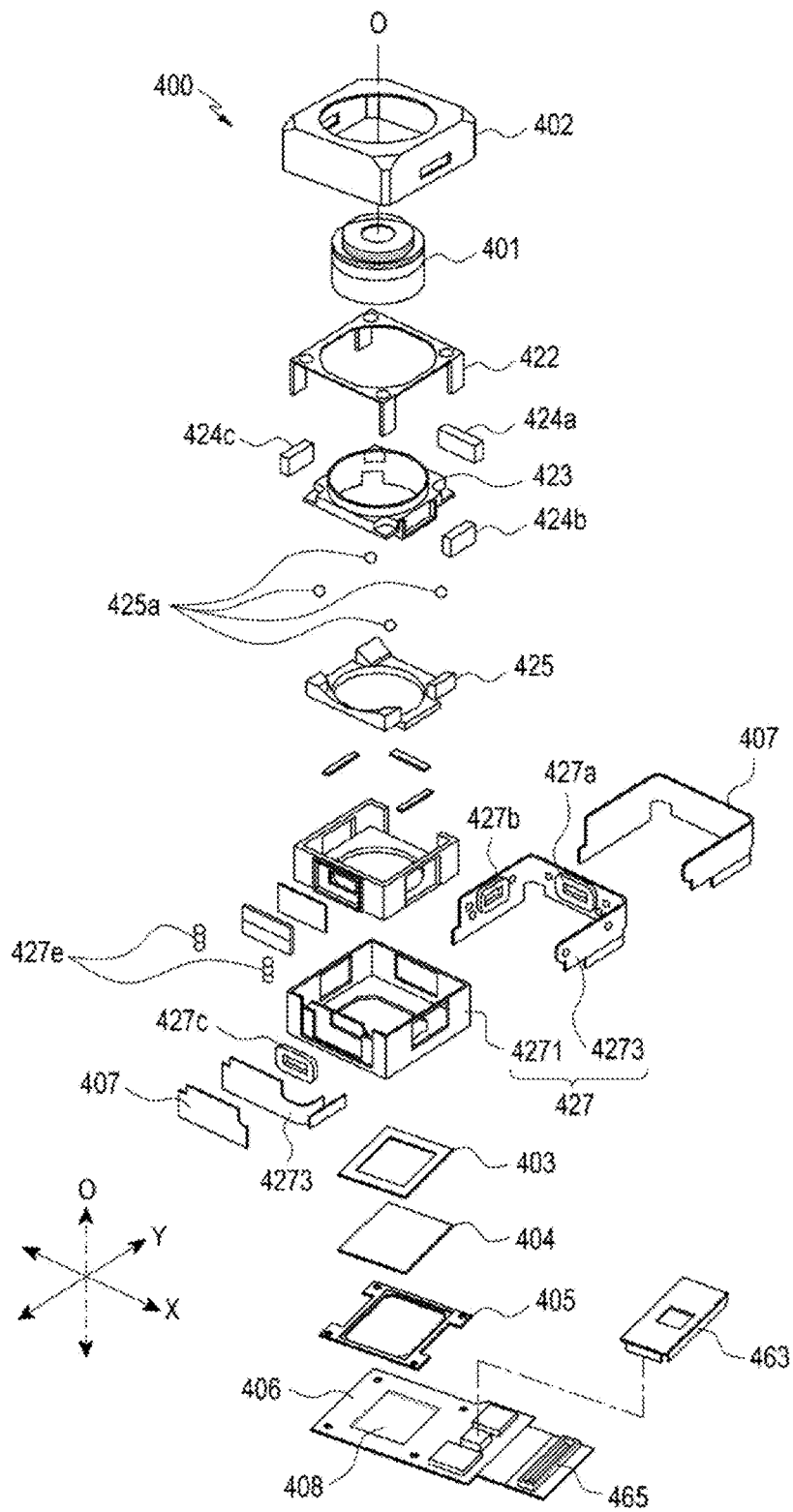
FIG. 4 illustrates an exploded perspective view depicting part of a camera assembly according to an embodiment of the present disclosure.

FIG. 4 illustrates an exploded perspective view depicting part of a camera assembly 400 according to an embodiment of the present disclosure. The camera assembly 400 of FIG. 4 may wholly or partially have the same configuration as the camera assembly 400 of FIG. 3.

Referring to FIG. 4, according to an embodiment of the present disclosure, the camera assembly 400 included in an electronic device (e.g., the electronic device 300 of FIG. 3) may include a lens module 401, a metal case 402, a supporting member 405, a board 406, an image sensor 408, an infrared (IR) filter 404, and a shielding structure 407.

According to an embodiment of the present disclosure, the lens module 401 may include a plurality of lenses. As another example, the metal case 402 may cover the remaining components of the camera assembly and shield off electromagnetic waves radiated from the camera assembly 400. The metal case 402 may include a carrier 423 and a driver 427. According to an embodiment of the present disclosure, the carrier 423 may receive the lens module 401 and may move along with the lens module 401. The carrier 423 may include a plurality of magnetic bodies 424a, 424b, and 424c.

According to an embodiment of the present disclosure, the driver 427 may receive and move the carrier 423. For example, the driver 427 may be an autofocusing actuator or an image stabilizing actuator. The driver 427 may electrically be connected with the board 406. The driver 427 may move the lens module 401 received in the case 402 to perform an autofocusing or image stabilizing function. The driver 427 may include a bracket 4271 covering the lens module 401 and flexible circuit board 4273 disposed to surround the bracket 4271.

According to an embodiment of the present disclosure, the driver 427 may include a plurality of coils 427a, 427b, and 427c on the inner surface of the flexible circuit board 4273. The plurality of coils 427a, 427b, and 427c may produce attractive/repulsive forces to the plurality of magnetic bodies 424a, 424b, and 424c depending on voltages applied thereto, moving the lens module 401 in the carrier 423 forward or backward along the optical axis O and hence autofocusing the camera assembly. The driver 427 may move the carrier 423 along the direction perpendicular to the optical axis O and on the X-Y plane, enabling image stabilization on the camera assembly. For example, a first bearing 425a may roll, moving the carrier 423 on the X-Y plane. A second bearing 427e may roll to move the carrier 423 along the optical axis O.

According to an embodiment of the present disclosure, the metal case 402 has a stopper 422. The stopper 422 may prevent the lens module 401 from escaping off the case 402 along the optical axis O. A guide 425 may be provided in the case 402. The guide 425 may be disposed between the carrier 423 and the driver 427 to guide and support the carrier 423 that moves.

According to an embodiment of the present disclosure, the metal case 402 may be formed of a conductive material to prevent electromagnetic waves from being radiated from the plurality of coils 427a, 427b, and 427c to the outside of the case 402.

According to an embodiment of the present disclosure, the supporting member 405 may be attached onto the inner surface of the case 402 and be mounted on the board 406. The supporting member 405 may be formed of a resin. According to an embodiment of the present disclosure, the supporting member 405 is not limited as formed of a resin but may rather be formed of a metal or other conductive material.

According to an embodiment of the present disclosure, the electronic parts for operating the camera assembly may be mounted on the board 406. For example, the electronic parts may be a driving controller for driving the driver 427 and a memory. The electronic parts may be surrounded by a shield can 463 while being mounted on the board 406. The shield can 463 may be formed of a metal to shield off electromagnetic waves radiated from the electronic parts. A terminal 465 may be provided on the board 406 to enable electrical connection of a circuit board (e.g., the printed circuit board 340 of FIG. 3) via connecting terminals. According to an embodiment of the present disclosure, the board 406 may be part of the circuit board (e.g., the printed circuit board 340 of FIG. 3).

According to an embodiment of the present disclosure, the image sensor 408 may be mounted on the board 406. The supporting member 405 may form a closed loop around the image sensor 408 and may be mounted on the board 406.

According to an embodiment of the present disclosure, the IR filter 404 may be received in the supporting member 405. The IR filter 404 may be disposed between the lens module 401 and the image sensor 408. The IR filter 404 may be formed of glass or a resin. According to an embodiment of the present disclosure, the IR filter 404 may be formed of a film. The IR filter 404 may be a filter to block IR rays. According to an embodiment of the present disclosure, the IR filter 404 is not limited as an IR blocking filter. For example, the IR filter may be a filter that may transmit only IR rays. For example, the IR transmitting filter may be utilized to recognize the user's iris.

According to an embodiment of the present disclosure, the shielding structure 407 may be attached onto at least a portion of the flexible circuit board 4273. The shielding structure 407 may be formed of a conductive material, which is described below in greater detail.

Figure 5:
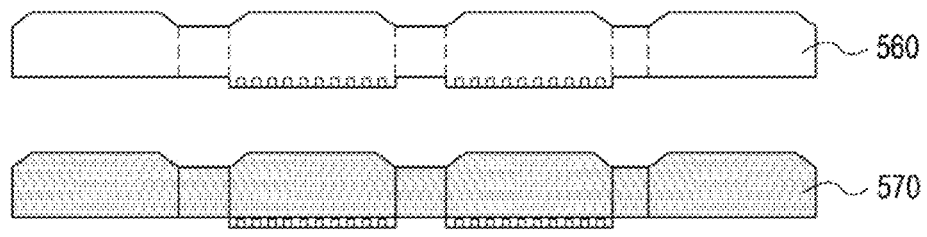
FIG. 5 illustrates a view of a flexible circuit board and a shielding structure arranged on an outer surface of a bracket of a camera assembly according to an embodiment of the present disclosure.
Figure 6:
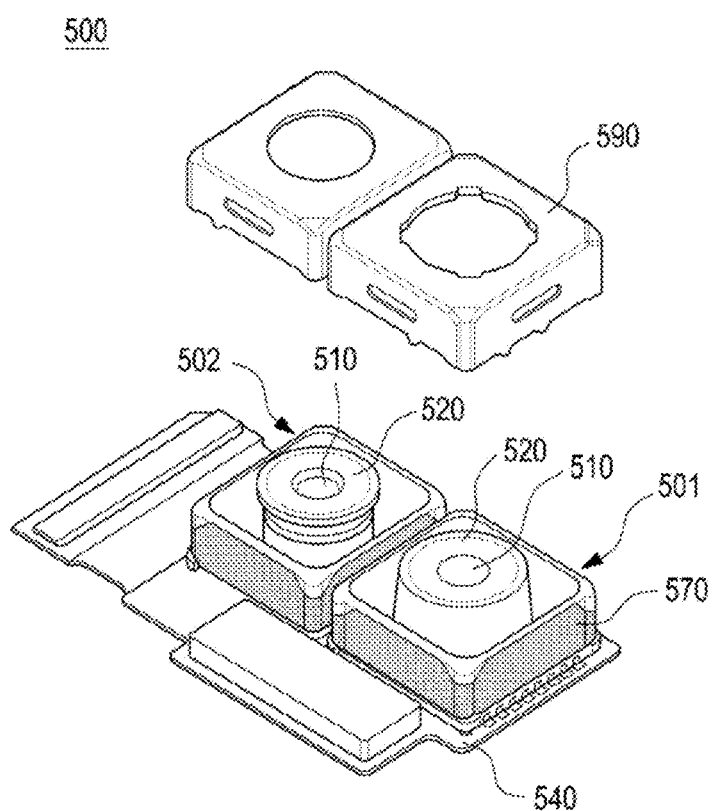
FIG. 6 illustrates an exploded perspective view of a shielding structure disposed in a dual-camera assembly structure according to an embodiment of the present disclosure.
Figure 7:
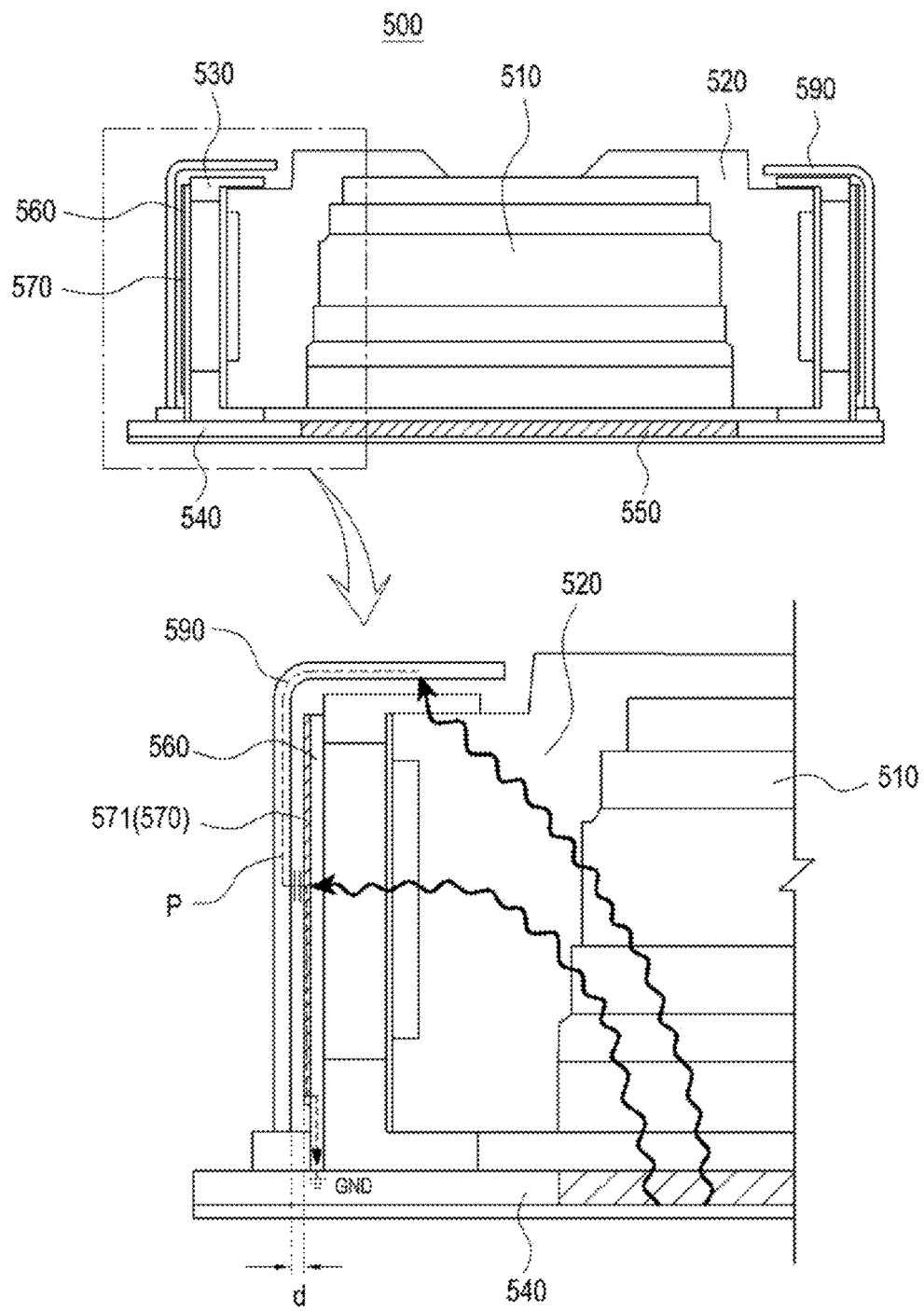
FIG. 7 illustrates a side cross-sectional view of at least one camera assembly of a dual-camera assembly structure according to an embodiment of the present disclosure.

FIG. 5 illustrates a view of a flexible circuit board 560 and a shielding structure 570 arranged on an outer surface of a bracket (e.g., the bracket 4271 of FIG. 4) of a camera assembly according to an embodiment of the present disclosure. FIG. 6 illustrates an exploded perspective view of a shielding structure disposed in a dual-camera assembly structure 500 according to an embodiment of the present disclosure. FIG. 7 illustrates a side cross-sectional view of at least one camera assembly of a dual-camera assembly structure 500 according to an embodiment of the present disclosure.

The flexible circuit board 560 and the shielding structure 570 of the camera assembly as shown in FIGS. 5 to 7 may be wholly or partially the same as the flexible circuit board 4273 and the shielding structure 407 of FIG. 4.

Referring to FIGS. 5 to 7, the flexible circuit board 560 may be formed to overall surround the side surface of the lens module 510 (e.g., the lens module 510 of FIG. 7). For example, the flexible circuit board 560 may be attached via an adhesive to four outer surfaces of a rectangular bracket, and its bottom may come in contact with a board (e.g., the board 540 of FIG. 7). The flexible circuit board 560 may first be formed of a flat board that may then be rendered into a rectangular structure to fit the outer shape of the bracket (e.g., the bracket 530 of FIG. 7).

According to an embodiment of the present disclosure, the shielding structure 570 may be attached onto at least a surface of the flexible circuit board 560. For example, the shielding structure 570 may be sized and shaped to correspond to the flexible circuit board 560 so that, where the flexible circuit board 560 is attached onto the four outer surfaces of the bracket 530, the shielding structure 570 may likewise be attached onto the four outer surfaces of the flexible circuit board 560. However, the shielding structure 570 is not limited to the shape. For example, where not all of the four surfaces are needed to be shielded, the shielding structure 570 may selectively be attached onto only one, two, or three of the four surfaces.

According to an embodiment of the present disclosure, the shielding structure 570 may be a shielding sheet member formed of a conductive material. For example, the shielding structure 570 may be formed of a metal, such as copper or silver or a metal alloy such as a copper alloy or silver alloy. According to an embodiment of the present disclosure, the shielding structure 570 is not limited as formed of a metal or metal alloy, but may also be formed of other various conductive materials, such as a conductive resin.

Referring back to FIGS. 6 and 7, the electronic device may include a dual-camera assembly structure 500. The dual-camera assembly structure 500 may include a first camera assembly 501 and a second camera assembly 502 disposed adjacent the first camera assembly 501.

According to an embodiment of the present disclosure, the electronic device (e.g., the electronic device 300 of FIG. 3) may be a device that may simultaneously, or may not simultaneously, drive the first camera assembly 501 and the second camera assembly 502 depending on hardware specifications or various device environments. For example, when the electronic device (e.g., the electronic device 300 of FIG. 3) is operated in a dual mode, the first camera assembly 501 and/or the second camera assembly 502 may be activated to obtain images. The electronic device (e.g., the electronic device 300 of FIG. 3) may provide an image obtained from one camera assembly while automatically activating the other camera assembly and supporting the other camera assembly to obtain an image, so that the pre-obtained image and the current image may be synthesized into a dual-mode image.

According to an embodiment of the present disclosure, the first camera assembly 501 may collect images as does the second camera assembly 502. Where the second camera assembly 502 is disposed to be exposed through the opening formed in the rear cover, the first camera assembly 501 may be disposed side-by-side with the second camera assembly 502 in the rear surface. The first camera assembly 501 may have hardware that is able to collect relatively high-resolution images as compared with the second camera assembly 502. Images collected by the first camera assembly 501 may be provided to a control module (not shown). The images collected by the first camera assembly 501 may be provided as preview images to a display module (not shown). Among the images collected by the first camera assembly 501, images requested to be captured may be stored in a storage module (not shown). To collect dual-mode images, the images requested to be captured, among the images collected by the first camera assembly 501, may temporarily be stored. The images collected by the first camera assembly 501 may be stored as texture and may be synthesized with images collected by the second camera assembly 502. The first camera assembly 501 may be in an inactive state while the second camera assembly 502 is activated. When operated in the dual mode, the first camera assembly 501 may automatically turn on after the second camera assembly 502 turns off.

According to an embodiment of the present disclosure, the second camera assembly 502 may be disposed side-by-side with the first camera assembly 501 in a side of the electronic device (e.g., the electronic device 300 of FIG. 3) to obtain images under the control of the user. For example, the second camera assembly 502 may obtain images for an object positioned in front of the rear surface of the electronic device (e.g., the electronic device 300 of FIG. 3). The second camera assembly 502 may obtain relatively low-resolution images as compared with the first camera assembly 501. Images collected by the second camera assembly 502 may be synthesized with images collected by the first camera assembly 501 into dual-mode images. The images collected by the second camera assembly 502 may be stored as texture and may be synthesized with images collected by the first camera assembly 501.

According to an embodiment of the present disclosure, each camera assembly in the dual-camera assembly structure 500 may include a lens module 510, a barrel 520, a bracket 530, a lower board 540, an image sensor 550, a flexible circuit board 560, and a shielding structure 570. The description of the lens module 401, the bracket 4271, the board 406, the image sensor 408, and the flexible circuit board 4273 of FIG. 4 may apply to the lens module 510, the bracket 530, the lower board 540, the image sensor 550, and the flexible circuit board 560. The shielding structure 570 is described below.

According to an embodiment of the present disclosure, the shielding structure 570 may be disposed between a metal case 590 and the flexible circuit board 560 to shield off electromagnetic waves radiated from the dual-camera assembly structure 500. Electromagnetic wave noise radiated from the dual-camera assembly structure 500 is electromagnetic interference (EMI) source-related noise which may be noise created when the image sensor 550 is operated and/or noise created from the board 540, on which the camera assemblies are mounted, due to the MIPI clock for controlling the dual-camera assembly structure 500. The large noise created by the MIPI clocks for controlling the dual-camera assembly structure 500 may play as spurious waves, i.e., noise, on the data communication band, deteriorating the transmit/receive sensitivity of the antenna and resultantly data communication performance.

According to an embodiment of the present disclosure, the shielding structure (e.g., the first shielding member 571) may be attached onto at least one of the four surfaces surrounding the camera barrel 520. For example, the first shielding member 571 may be attached onto the four surfaces as is the flexible circuit board 560 which surrounds the camera barrel 520 and the bracket 530, or the first shielding member 571 may selectively be attached onto one, two, or three of the four surfaces depending on the strength of noise radiated.

According to an embodiment of the present disclosure, the first shielding member 571 may directly be attached via an adhesive onto the flexible circuit board 560 which is disposed on the outer surfaces of the bracket 530 or the first shielding member 571 and the flexible circuit board 560 may be integrated into a single conductor. As another example, the first shielding member 571 may be electrically connected and attached to the flexible circuit board 560 via an adhesive.

According to an embodiment of the present disclosure, the first shielding member 571 of the shielding structure may be connected to the ground of the lower board 540, and the metal case 590 may have no electrical connection to the lower board 540, i.e., "floating." As another example, the first shielding member 571 may be spaced apart from the metal case 590 at a predetermined gap d. The gap d may remain even over the inside surface of the metal case 590.

According to an embodiment of the present disclosure, as the metal case 590 and the first shielding member 571 connected to the ground of the lower board 540 are spaced apart from each other at the gap d, a coupling capacitance may be formed therebetween. This builds up an alternating current (AC) ground GND that may shield off electromagnetic wave noise radiated from the camera assembly. The gap d may be filled with air or a dielectric with a predetermined permittivity. For example, the AC ground GND may lead to forming a path P along which AC component electromagnetic wave noise created inside and/or outside the camera assembly travels to the ground GND. As set forth above, the metal case 590 is not connected with the lower board 540, i.e., "floats," allowing the metal case 590 to be utilized as an anti-electric shock member.

Equation 1 below represents the coupling capacitance between the metal case 590 and the first shielding member 571 which is a conducting electrode.

$$C = e\frac{A}{d} \qquad \text{[Equation 1]}$$

In Equation 1, e refers to the permittivity of the air or dielectric filling the gap, A refers to the area of the metal case 590 and the first shielding member 571, and d refers to the gap.

According to an embodiment of the present disclosure, the capacitance may be varied depending on the gap d between the metal case 590 and the first shielding member 571 and the area A of the first shielding member 571, and the per-frequency EMI shielding capability may also be varied depending on the capacitance. For example, at least a capacitance of about 100 pF (which is described below) may be used to shield off noise radiations from the dual-camera assembly structure 500 that are main noise to negatively influence the low band antenna. Where the first shielding member 571 is configured with four surfaces surrounding the lens module 510, the size of the conductors and the distance between the conductors may be determined so that each of the four surfaces forms a capacitance of 25 pF to thereby achieve the 100 pF capacitance.

Only one of the four surfaces of the first shielding member 571 surrounding the camera lens module 510 may be disposed depending on the strength of noise radiated from the dual-camera assembly structure 500. For example, even where the first shielding member 571 is configured with two or three, not four, surfaces, and is attached onto the flexible circuit board 560, the total area A of the two or three surfaces may serve as the area A for setting the capacitance as per Equation 1. According to an embodiment of the present disclosure, where the first shielding member 571, i.e., a conducting electrode, is attached onto the flexible circuit board so that an AC ground is formed through the coupling capacitance between the first shielding member 571 and the case, it may primarily shield off electromagnetic waves in a physical manner and secondarily shield off noise radiated as the camera assembly operates, thereby leading to a one to two dB enhancement in the reception sensitivity of the antenna.

Figure 8:
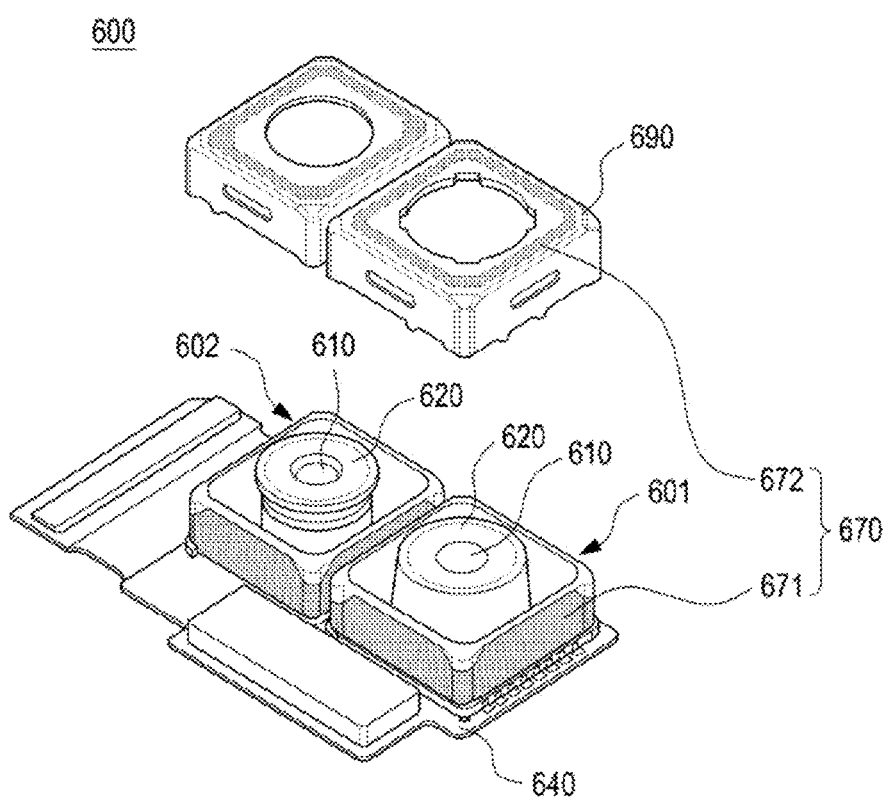
FIG. 8 illustrates an exploded perspective view of a shielding structure of a dual-camera assembly structure according to an embodiment of the present disclosure.
Figure 9:
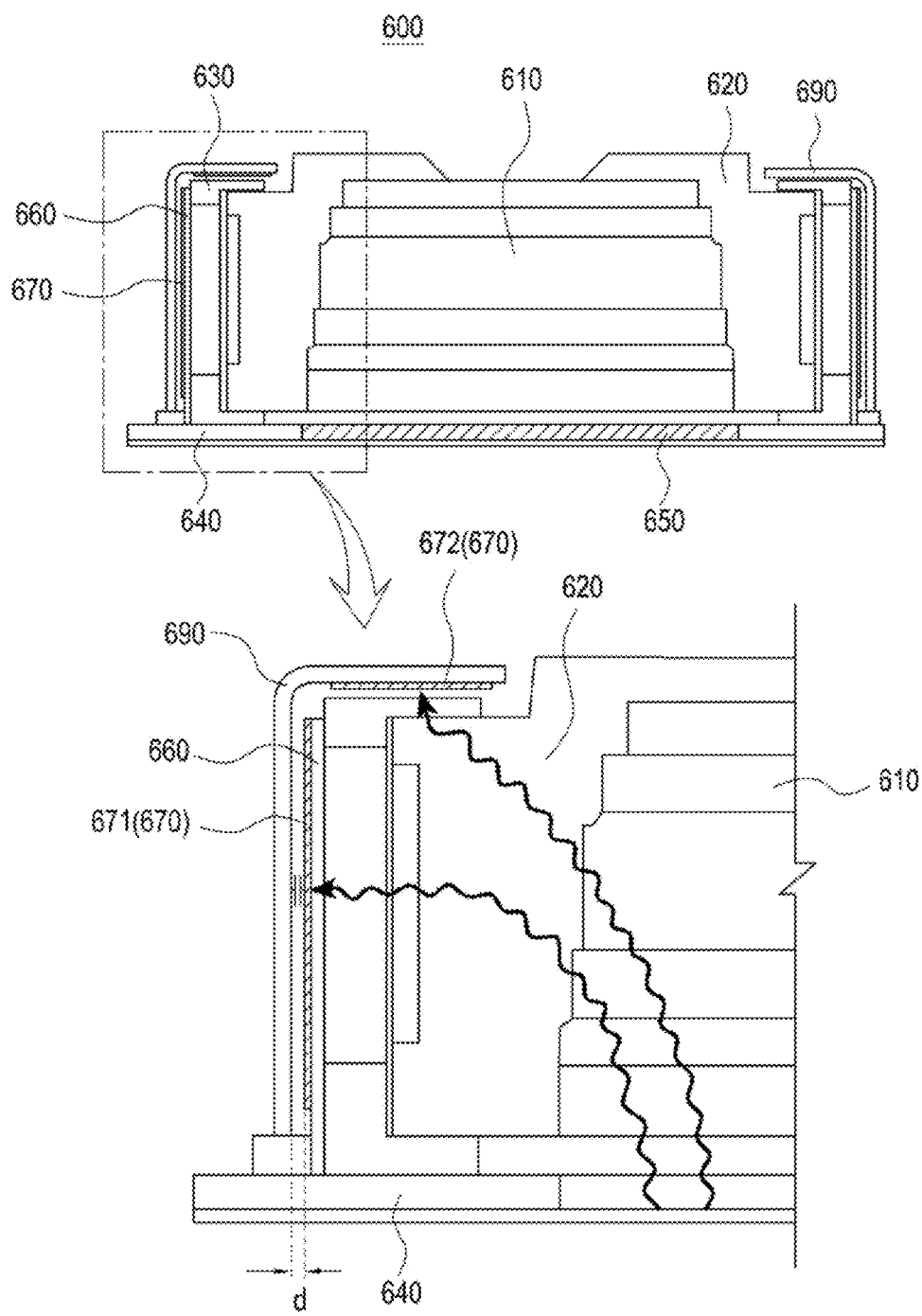
FIG. 9 illustrates a side cross-sectional view of at least one camera assembly of a dual-camera assembly structure according to an embodiment of the present disclosure.

FIG. 8 illustrates an exploded perspective view of a shielding structure 670 of a dual-camera assembly structure 600 according to an embodiment of the present disclosure. FIG. 9 illustrates a side cross-sectional view of at least one camera assembly of a dual-camera assembly structure 600 according to an embodiment of the present disclosure.

The dual-camera assembly structure 600 and the shielding structure 670 of FIGS. 8 and 9 may be the same in whole or part as the dual-camera assembly structure 500 and the shielding structure 570 of FIGS. 5 to 7.

Referring to FIGS. 8 and 9, the electronic device may include a dual-camera assembly structure 600. The dual-camera assembly structure 600 may include a first camera assembly 601 and a second camera assembly 602 disposed adjacent the first camera assembly 601.

According to an embodiment of the present disclosure, each camera assembly in the dual-camera assembly structure 600 may include a lens module 610, a barrel 620, a bracket 630, a lower board 640, an image sensor 650, a flexible circuit board 660, a metal case 690, and a shielding structure 670.

According to an embodiment of the present disclosure, the shielding structure 670 may be disposed between a metal case 690 and the flexible circuit board 660 to shield off electromagnetic waves radiated from the dual-camera assembly structure 600. Electromagnetic wave noise radiated from the dual-camera assembly structure 600 is electromagnetic interference (EMI) source-related noise which may be noise created when the image sensor 650 is operated and/or noise created from the board 640, on which the camera assemblies are mounted, due to the MIPI clocks for controlling the dual-camera assembly structure 600.

According to an embodiment of the present disclosure, the shielding structure 670 may include a first shielding member 671 disposed between the metal case 690 and the flexible circuit board 660 and a second shielding member 672 disposed on the top of the metal case 690.

According to an embodiment of the present disclosure, the first shielding member 671 may be attached to face at least one of the four surfaces surrounding the camera lens module 610. For example, the first shielding member 671 may be attached onto the four surfaces as is the flexible circuit board 660 which surrounds the bracket 630, or the first shielding member 671 may selectively be attached onto one, two, or three of the four surfaces depending on the strength of noise radiated. The first shielding member 671 may directly be attached via an adhesive onto the flexible circuit board 660 which is disposed on the outer surfaces of the bracket 630 or the first shielding member 571 and the flexible circuit board 660 may be integrated into a single conductor. As another example, the first shielding member 671 may be electrically connected and attached to the flexible circuit board 660 via an adhesive.

According to an embodiment of the present disclosure, the second shielding member 672 may be attached onto an inside surface of the metal case 690 that faces the image sensor 650, shielding off noise radiated up.

According to an embodiment of the present disclosure, the second shielding member 672 may be shaped to surround the barrel 620 and the opening of the metal case 690, and the area in which the second shielding member 672 surrounds the metal case 690 may be varied depending on the radius of the camera lens module 610. For example, since the lens module of the second camera assembly 602 is larger in radius than the lens module of the first camera assembly 601, the second shielding member 672 may take up a relatively more area around the first camera assembly 601.

According to an embodiment of the present disclosure, the second shielding member 672 may provide an additional shielding against noise radiated upwards. The second shielding member 672 shields off electromagnetic waves, minimizing an influence of electromagnetic wave noise on its peripheral electronic parts, e.g., its peripheral antenna. This may enhance the transmit/receive sensitivity of the antenna and secure a better data communication performance.

Figure 10:
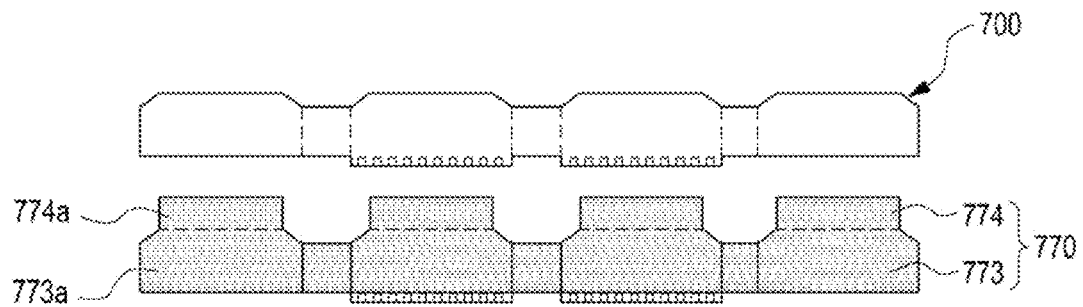
FIG. 10 illustrates a view of a flexible circuit board and a shielding structure arranged on an outer surface of a bracket of a camera assembly according to an embodiment of the present disclosure.
Figure 11:
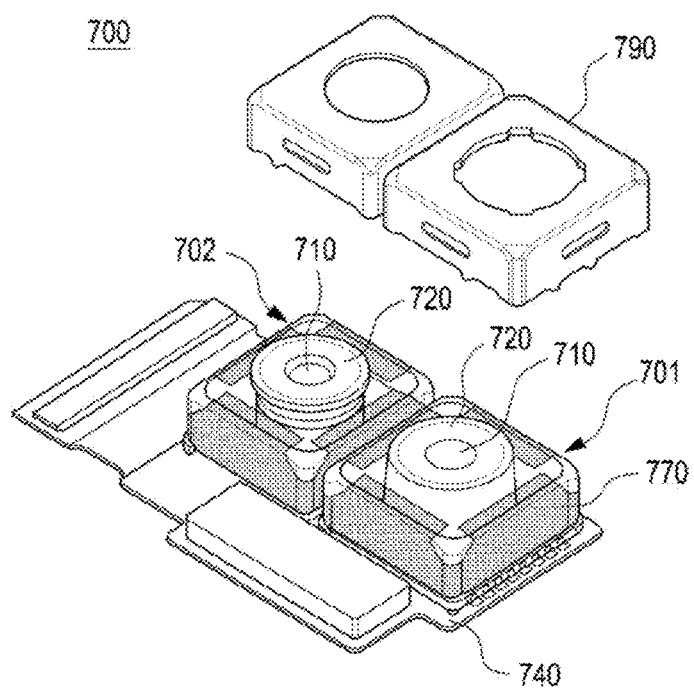
FIG. 11 illustrates an exploded perspective view of a shielding structure disposed in a dual-camera assembly structure according to an embodiment of the present disclosure.
Figure 12:
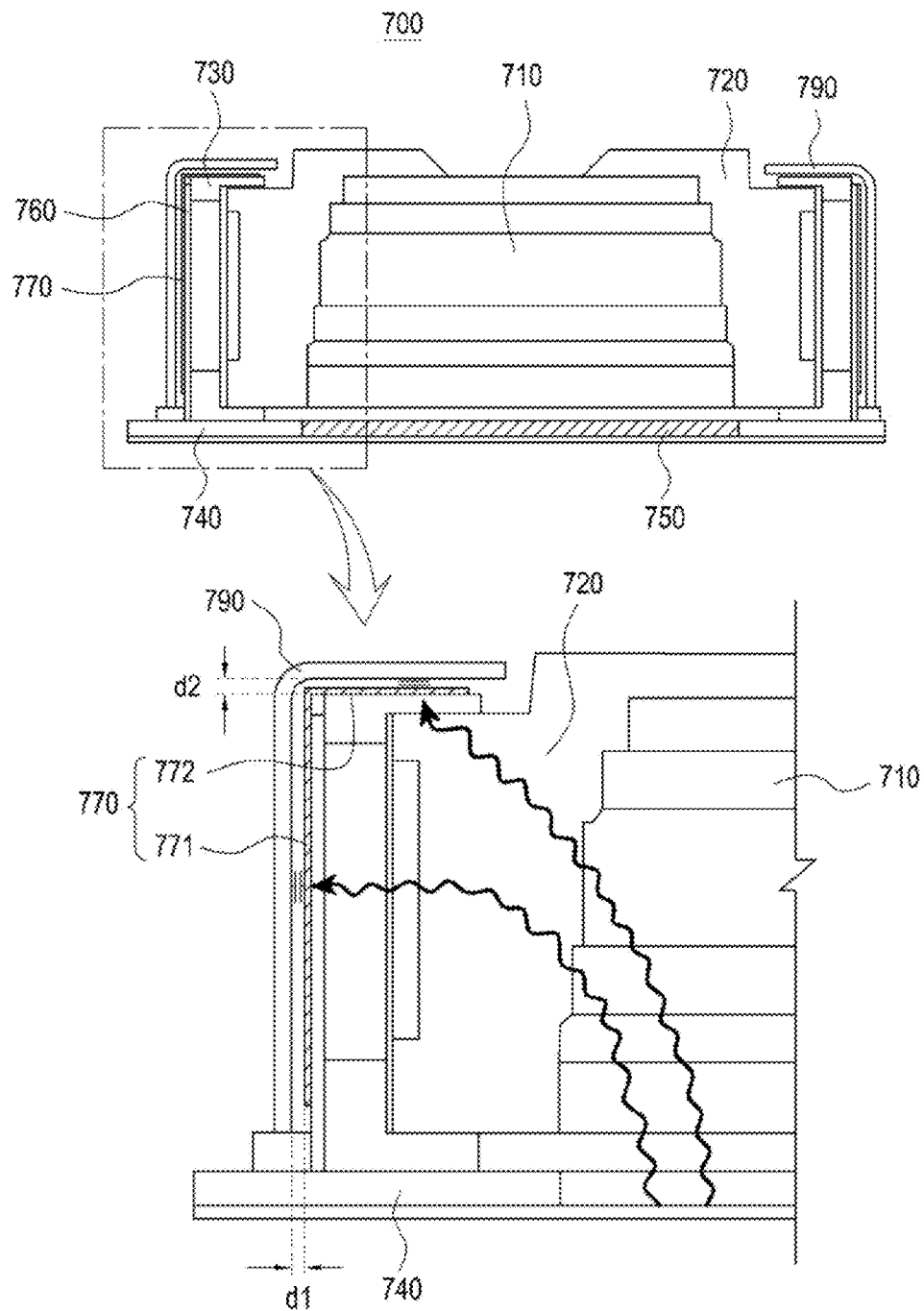
FIG. 12 illustrates a side cross-sectional view of at least one camera assembly of a dual-camera assembly structure according to an embodiment of the present disclosure.

FIG. 10 illustrates a view of a flexible circuit board 760 and a shielding structure 770 arranged on an outer surface of a bracket (e.g., the bracket 4271 of FIG. 4) of a dual-camera assembly structure according to an embodiment of the present disclosure. FIG. 11 illustrates an exploded perspective view of a shielding structure disposed in a dual-camera assembly 700 according to an embodiment of the present disclosure. FIG. 12 illustrates a side cross-sectional view of at least one camera assembly of a dual-camera assembly structure 700 according to an embodiment of the present disclosure.

The flexible circuit board 760 and the shielding structure 770 of FIGS. 10 to 12 may be wholly or partially the same as the flexible circuit board 4273 and the shielding structure 407 of FIG. 4.

Referring to FIGS. 10 to 12, the flexible circuit board 760 may be formed to overall surround the side surface of the lens module (e.g., the lens module 401 of FIG. 4). For example, the flexible circuit board 760 may be attached via an adhesive to four outer surfaces of a rectangular bracket, and its bottom may come in contact with a board (e.g., the board 406 of FIG. 4).

According to an embodiment of the present disclosure, the shielding structure 770 may be attached onto at least a surface of the flexible circuit board 760. For example, the shielding structure 770 may be sized and shaped to correspond to the flexible circuit board 760 so that, where the flexible circuit board 760 is attached onto the four outer surfaces of the bracket 730, the shielding structure 770 may likewise be attached onto the four outer surfaces of the flexible circuit board 760. However, the shielding structure 770 is not limited to the shape. For example, where not all of the four surfaces are needed to be shielded, the shielding structure 570 may selectively be attached onto only one, two, or three of the four surfaces.

According to an embodiment of the present disclosure, the shielding structure 770 may include a side area 773 and an upper area 774 extending from the side area 773. For example, a first upper area 774a extending from a first side 773a in an upper direction +Z may be attached onto the top of the bracket (e.g., the bracket 4271 of FIG. 4) to provide an additional shielding. The shielding structure 770 may be a shielding sheet member formed of a conductive material. For example, the shielding structure 770 may be formed of a metal, such as copper or silver or a metal alloy such as a copper alloy or silver alloy. According to an embodiment of the present disclosure, the shielding structure 770 is not limited as formed of a metal or metal alloy, but may also be formed of other various conductive materials, such as a conductive resin.

Referring back to FIGS. 11 and 12, the electronic device may include a dual-camera assembly structure 700. The dual-camera assembly structure 700 may include a first camera assembly 701 and a second camera assembly 702 disposed adjacent the first camera assembly 701.

According to an embodiment of the present disclosure, each camera assembly in the dual-camera assembly structure 700 may include a lens module 710, a barrel 720, a bracket 730, a lower board 740, an image sensor 750, a flexible circuit board 760, and a shielding structure 770. According to an embodiment of the present disclosure, the shielding structure 770 may be disposed between a metal case 790 and the lens module 710 to shield off electromagnetic waves radiated from the dual-camera assembly structure 700.

According to an embodiment of the present disclosure, the shielding structure 770 may include a first shielding member 771 disposed between the metal case 790 and the flexible circuit board 760 and a second shielding member 772 extending from the first shielding member 771 and disposed on the top of the metal case 790. The description of the first shielding member 571 of FIGS. 6 and 7 may apply to the first shielding member 771. The configuration of the second shielding member 772 is described below.

According to an embodiment of the present disclosure, the second shielding member 772 may be disposed opposite at least one surface of the metal case 790 and may be attached onto the top of the bracket 730 while facing in the first direction +Z. The surface of the metal case 790, which faces in the upper direction +Z, may shield off noise radiated upwards of the dual-camera assembly structure 700, and the second shielding member 772 may provide an additional shielding against noise radiated upwards. As another example, the second shielding member 772 may extend from the first shielding member 771 and be spaced apart from the metal case 790 at a predetermined second gap d2. For example, the second gap d2 between the second shielding member 772 and the metal case 790 may be the same as the gap d between the first shielding member 571 and the metal case 590 described above in connection with FIGS. 6 and 7.

According to an embodiment of the present disclosure, the gap d2 may overall remain even between the second shielding member 772, which is formed on the top of the bracket 730 in at least one direction and the inside surface of the case which faces the image sensor 750. The second gap d2 structure formed by the metal case 790 and the second shielding member 772 may produce an extra capacitance in addition to the coupling capacitance between the metal case 790 and the first shielding member 771, i.e., a conducting electrode, thereby building up an AC ground that is able to shield off electromagnetic waves radiated from the camera assembly.

According to an embodiment of the present disclosure, the second shielding member 772, along with the first shielding member 771, may provide an area A for setting a capacitance as per Equation 1 described above. The first shielding member 771 surrounding the camera lens module 710 may be attached onto all, or only some, of the four surfaces depending on the strength of noise radiated from the dual-camera assembly structure 700. For example, even where the first shielding member 771 is configured with only two or three surfaces, with some surfaces between the camera assemblies 700 excluded, and is attached onto the flexible circuit board 760, the sum of the area A of the two or three surfaces of the first shielding member 771 and the area A of the surfaces of the second shielding member 772 extending upwards may provide an area A value for setting a capacitance as per Equation 1 above.

As another example, the capacitance may be varied depending on the gap between the metal case 790 and the shielding structure 770 and the area A of the first shielding member 771 and the second shielding member 772, and the per-frequency EMI shielding capability may also be varied depending on the capacitance. For example, the second shielding member 772 extending from the first shielding member 771 may further increase the area of the shielding structure 770, enabling the capacitance to increase.

Now described are the correlation between a dual-camera assembly structure and an antenna of an electronic device and effects that the shielding structure may bring up.

Figure 13:
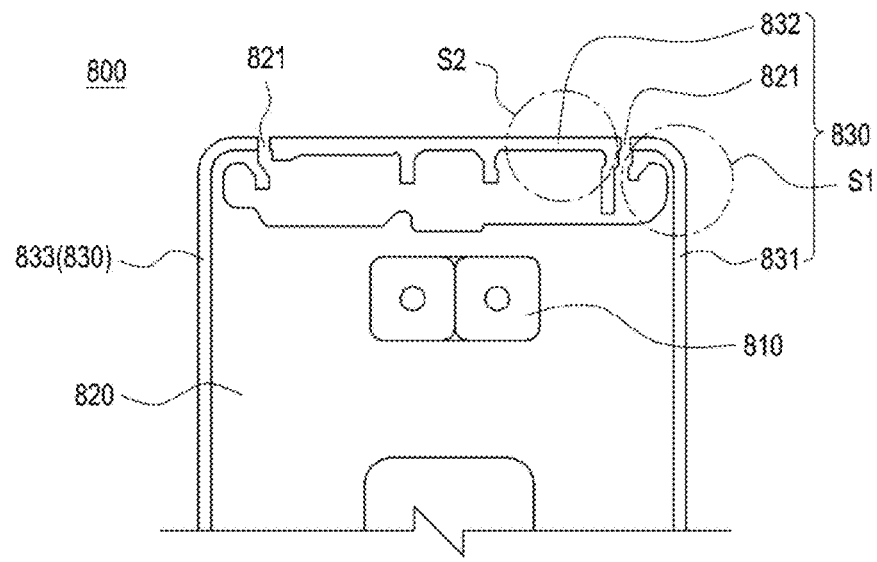
FIG. 13 illustrates a view schematically depicting a dual-camera assembly structure disposed inside an electronic device and an antenna forming the outer surface of the electronic device, according to an embodiment of the present disclosure.

FIG. 13 illustrates a view schematically depicting a dual-camera assembly structure 810 disposed inside an electronic device 800 and an antenna 830 forming the outer surface of the electronic device 800, according to an embodiment of the present disclosure.

The dual-camera assembly structure 810 of FIG. 13 may wholly or partially be the same in structure as the dual-camera assembly structures 400, 500, 600, and 700 of FIGS. 4 to 11.

Referring to FIG. 13, the dual-camera assembly structure 810 may be disposed to, at least partially, expose the lenses through the opening formed in the rear cover of the electronic device 800. The dual-camera assembly structure 810 may be configured of a reduced number of parts according to a need for being compact and may thus be highly integrated with its peripheral electronic parts. Electromagnetic waves may be radiated as the inner parts (e.g., image sensors and circuit board) of the dual-camera assembly structure 810. The dual-camera assembly structure 810 may include a shielding structure (e.g., the shielding structure 570) to prevent interference with the peripheral parts and control circuits. The electromagnetic waves radiated from the assembly structure may have a significant influence on the metal housing of the electronic device 800, which surrounds the dual-camera assembly structure 810. The electromagnetic waves may negatively affect the antenna functionality, e.g., radio frequency (RF) performance, of the housing.

According to an embodiment of the present disclosure, the metal housing 820 that functions as an antenna for the electronic device 800 may be divided into a plurality of antennas by slits 821. For example, at front view of the electronic device 800, a first antenna 831 and a third antenna 833 may be disposed at both sides of the dual-camera assembly structure 810, and a second antenna 832 may be disposed at a side over the top of the dual-camera assembly structure 810. The first antenna 831 and the third antenna 833 may face each other, with the second antenna 832 disposed therebetween.

According to an embodiment of the present disclosure, the frequency bands for the plurality of antennas 830 which are directly influenced by electromagnetic wave noise radiated from the dual-camera assembly structure 810, may be a high band (e.g., 2300 MHz to 2700 MHz) of the first antenna 831 and a low band (e.g., 700 MHz to 1000 MHz) of the second antenna 832.

Figure 14:
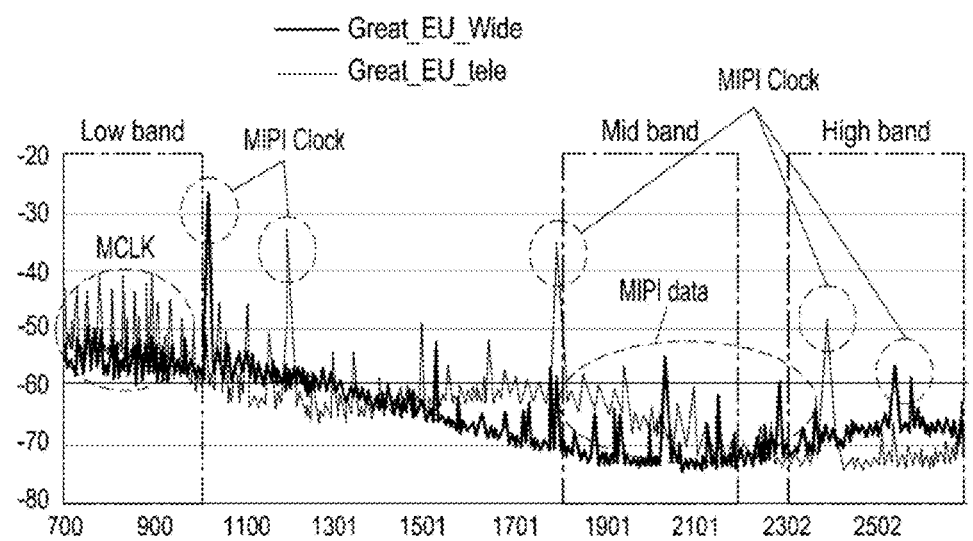
FIG. 14 illustrates a graph depicting electromagnetic wave noise radiated from a dual-camera assembly structure with no shielding structure for a band from 700 MHz to 2700 MHz, according to an embodiment of the present disclosure.

FIG. 14 illustrates a graph depicting electromagnetic wave noise radiated from a dual-camera assembly structure with no shielding structure for a band from 700 MHz to 2700 MHz, according to an embodiment of the present disclosure.

It can be verified from FIGS. 13 and 14 that relatively more noise is radiated in the low band than a mid band/high band. Also verified is that the noise creation occurs over a wider range than in the other bands, due to the harmonics of the MIPI clock and main clock (MCLK).

It can be shown that while in the mid/high band, the noise radiated from the dual-camera assembly structure does not make a significant difference over the noise floor, the noise in the low band has been about 20 dB up relative to the wide band noise floor due to the MIPI data.

The signal-to-noise ratio (SNR) (=Ps (signal power)/Pn (noise power)) relatively reduces as the noise increases, and a lowering in the SNR causes the bit error rate (BER) to be relatively high, with the result of a deterioration of the antenna reception sensitivity.

Referring to Table 1 below, the antenna reception sensitivity is specifically measured depending on whether the dual-camera assembly structure operates or not.

By measuring the cell power on the low band, it can be verified that the antenna reception sensitivity is about −87 dB to −88 dB while the LCD remains off, e.g., the camera assembly does not work. As another example, while the camera assembly operates, the antenna reception sensitivity may be verified to be about −79 dB to −86 dB. It can be verified that while the camera assembly (metal case, e.g., a shield can) operates, noise radiations from the camera assembly causes the antenna reception sensitivity on the low band a difference ranging from about 2.8 dB to about 8.2 dB for a first camera (e.g., a wide cam) and a difference ranging from about 2.1 dB to about 6.4 dB for a second camera (e.g., a Tele cam).

TABLE 1

| Low band- down link(MHZ) | | B28 (758~803) | Δ | B20 (791~821) | Δ | B5 (869~894) | Δ | B8 (925~960) | Δ |
|---|---|---|---|---|---|---|---|---|---|
| LCD OFF | | −87.36 | | −88.68 | | −87.05 | | −87.99 | |
| Metal case | WIDE CAM | −79.11 | 8.25 | −82.11 | 6.57 | −81.92 | 5.13 | −85.17 | 2.82 |
| | TELE CAM | −80.96 | 6.40 | −86.18 | 2.50 | −81.64 | 5.41 | −85.88 | 2.11 |

To address the antenna reception sensitivity issues that noise causes, the metal case (e.g., a shield can) may be attached onto the camera assembly to shield off EMI noise. However, this way would not work for the dual-camera assembly structure because relatively more electromagnetic waves are radiated than when a single camera assembly is put to use.

From Table 2 that represents measurements for the antenna reception sensitivity depending on whether the dual-camera assembly structure with a shielding structure operates or not, it can be verified that the antenna reception sensitivity has relatively increased.

TABLE 2

| Low band- down link(MHZ) | | B28 (758~803) | Δ | B20 (791~821) | Δ | B5 (869~894) | Δ | B8 (925~960) | Δ |
|---|---|---|---|---|---|---|---|---|---|
| LCD OFF | | −87.36 | | −88.68 | | −87.05 | | −87.99 | |
| Metal case | WIDE CAM | −79.11 | 8.25 | −82.11 | 6.57 | −81.92 | 5.13 | −85.17 | 2.82 |
| | TELE CAM | −80.96 | 6.40 | −86.18 | 2.50 | −81.64 | 5.41 | −85.88 | 2.11 |
| First shielding member | WIDE CAM | −80.39 | 6.97 | −82.52 | 6.16 | −83.84 | 3.21 | −86.14 | 1.85 |
| | TELE CAM | −83.19 | 4.17 | −86.93 | 1.75 | −83.97 | 3.08 | −86.82 | 1.17 |

TABLE 2-continued

| Low band- down link(MHZ) | | B28 (758~803) | Δ | B20 (791~821) | Δ | B5 (869~894) | Δ | B8 (925~960) | Δ |
|---|---|---|---|---|---|---|---|---|---|
| First shielding member + metal case | WIDE CAM | −81.93 | 5.43 | −84.43 | 4.25 | −85.44 | 1.61 | −8.66 | 1.33 |
| | TELE CAM | −85.11 | 2.25 | −87.32 | 1.36 | −85.07 | 1.98 | −86.93 | 2.06 |

According to an embodiment of the present disclosure, it can be verified that noise radiations from the camera assembly 810 may be shielded off and the antenna reception sensitivity has been enhanced about one to two dB by attaching a conducting electrode, i.e., a shielding structure (e.g., the first shielding member 571 of FIG. 5), onto the flexible circuit board in the dual-camera assembly structure 810.

It can be verified that, as compared with before operating the camera assembly, the antenna reception sensitivity on the low band presents a difference ranging from about 1.8 dB to 7.0 dB for the first camera (e.g., a wide cam) and a difference ranging from about 1.2 dB to 4.2 dB for the second camera (e.g., a Tele cam).

According to an embodiment of the present disclosure, it can be verified that noise radiations from the camera assembly may secondarily be shielded off and an extra reception sensitivity enhancement of about 1 dB to about 2 dB has been achieved by forming an AC ground through a coupling capacitance between the metal case and the shielding structure, i.e., the first shielding member (e.g., the first shielding member 571 of FIG. 5) in the dual-camera assembly structure 810.

It can be verified that, as compared with before operating the camera assembly, the antenna reception sensitivity on the low band presents a difference ranging from about 1.3 dB to 5.4 dB for the first camera (e.g., a wide cam) and a difference ranging from about 1.3 dB to 2.2 dB for the second camera (e.g., a Tele cam).

According to various embodiments of the present disclosure, a camera assembly has a shielding structure that may produce a coupling capacitance between metal case structures, effectively shielding off electromagnetic wave noise created from the camera assembly and providing a better shielding capability.

According to an embodiment of the present disclosure, an electronic device (e.g., the electronic device 300 of FIG. 3) may comprise a housing (e.g., the side bezel structure 310, supporting member 330, and rear cover 380 of FIG. 3) including a front plate, a back plate facing the front plate, and a side member surrounding a space between the front plate and the back plate, the side member including a plurality of non-conductive portions (e.g., the non-conductive portions 312A and 312B of FIG. 3) and a conductive portion (e.g., the conductive portion 312C of FIG. 3) inserted in contact between the non-conductive portions along at least a portion of a side surface of the side member, a display module (e.g., the display module 320 of FIG. 3) exposed through the front plate, at least one wireless communication circuit (e.g., the communication module 190 of FIG. 1) electrically connected with the conductive portion, a printed circuit board (PCB) (e.g., the printed circuit board 340 of FIG. 3) disposed between the display module and the back plate, and a camera assembly (e.g., the camera assemblies 400 and 500 of FIGS. 3 and 6) disposed between the printed circuit board and the back plate, mounted on a surface of the printed circuit board, and exposed through a portion of the back plate.

The camera assembly may include an image sensor (e.g., the image sensor 550 of FIG. 7) disposed on the printed circuit board, a plurality of lenses (e.g., the lens module 510 of FIG. 6) stacked over one another between the image sensor and the portion of the back plate, a barrel (e.g., the barrel 520 of FIG. 6) positioned between the PCB and the back plate while laterally surrounding the plurality of lenses, a camera bracket (e.g., the camera bracket 530 of FIG. 7) positioned between the PCB and the back plate while laterally surrounding at least part of the barrel, a metal case (e.g., the metal case 590 of FIG. 6) positioned between the PCB and the back plate while laterally surrounding at least part of the camera housing, and a shielding structure (e.g., the shielding structure 570 of FIG. 6) interposed between the camera bracket and the metal case while being spaced from the metal case.

According to an embodiment of the present disclosure, the metal case may be electrically separated from the printed circuit board.

According to an embodiment of the present disclosure, the shielding structure may be electrically connected with the printed circuit board.

According to an embodiment of the present disclosure, the camera assembly may further include a magnetic component in the camera bracket, and a portion of the shielding structure may be interposed between the magnetic component and the metal case.

According to an embodiment of the present disclosure, the camera assembly may further include a flexible circuit board interposed between the camera bracket and the shielding structure.

According to an embodiment of the present disclosure, the magnetic component may be configured to provide an automatic focusing and/or optical image stabilization (OIS) function.

According to an embodiment of the present disclosure, the camera assembly may further include a coil interposed between the magnetic component and the shielding structure.

According to an embodiment of the present disclosure, the metal case may be formed of stainless steel (SUS).

According to an embodiment of the present disclosure, the wireless communication circuit may be configured to transmit and/or receive a signal in a frequency range between 700 MHz to 1000 MHz.

According to an embodiment of the present disclosure, the shielding structure may have a first surface that faces the flexible circuit board to surround an outer surface of the bracket and a second surface that is spaced apart from the metal case at a predetermined gap.

According to an embodiment of the present disclosure, the camera assembly may be configured to form an alternating current (AC) ground by producing a coupling capacitance between the metal case and the shielding structure which are spaced apart from each other at the predetermined gap.

According to an embodiment of the present disclosure, the shielding structure may include a first shielding member surrounding an outer surface of the bracket and spaced apart from a side surface of the metal case and a second shielding member disposed on at least a portion of an upper surface of the metal case.

According to an embodiment of the present disclosure, the second shielding member may be shaped to surround the barrel and an opening of the metal case.

According to an embodiment of the present disclosure, the shielding structure may include a first shielding member surrounding an outer surface of the bracket and spaced apart from a side surface of the metal case and a second shielding member extending from the first shielding member and spaced apart from, and facing, at least a portion of an upper surface of the metal case.

According to an embodiment of the present disclosure, the first shielding member and the second shielding member may be arranged to be perpendicular to each other.

According to an embodiment of the present disclosure, an electronic device may include a camera assembly. The camera assembly may face to the rear of the electronic device. The camera assembly may comprise an image sensor disposed on a printed circuit board, a lens module exposed through an opening formed in a rear surface of the electronic device and including a plurality of lenses, a camera bracket at least partially surrounding a side surface of the lens module and configured to protect the lens module, a flexible circuit board at least partially surrounding an outer surface of the camera bracket and contacting the printed circuit board, a metal case at least partially surrounding an outer surface of the lens module and the camera bracket and configured to shield off an electromagnetic wave radiated from an inside of the camera assembly, and a shielding structure disposed between the flexible circuit board and the metal case and spaced apart from a side surface of the metal case.

According to an embodiment of the present disclosure, the camera assembly may be configured to form an alternating current (AC) ground by producing a coupling capacitance between the metal case and the shielding structure which are spaced apart from each other at the predetermined gap.

According to an embodiment of the present disclosure, the camera assembly may include dual-camera.

According to an embodiment of the present disclosure, the shielding structure may include a first shielding member surrounding an outer surface of the bracket and spaced apart from a side surface of the metal case and a second shielding member extending from the first shielding member and spaced apart from, and facing, at least a portion of an upper surface of the metal case.

According to an embodiment of the present disclosure, a surface of the first shielding member may be perpendicular to a surface of the second shielding member.

As is apparent from the foregoing description, according to various embodiments of the present disclosure, an electronic device including a camera assembly has a shielding structure inside the camera assembly, shielding off electromagnetic waves emitted from the inside.

According to various embodiments of the present disclosure, the camera assembly may shield off electromagnetic waves emitted from the image sensor or printed circuit board to control the camera assembly, cutting off electromagnetic noise from the ambient electronic parts.

According to various embodiments of the present disclosure, the camera assembly itself may block electromagnetic waves therefrom, or a shielding structure which produces a coupling capacitance with the casing structure may be provided to present a better shielding.

According to various embodiments of the present disclosure, the shielding member shields off electromagnetic waves emitted from the image sensor, preventing a performance deterioration of the electronic parts (e.g., an autofocusing actuator or image stabilizing actuator) in the camera assembly.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device, comprising:
    a housing including a front plate, a back plate facing away from the front plate, and a side member surrounding a space between the front plate and the back plate, the side member including a plurality of non-conductive portions and a conductive portion inserted in contact between the non-conductive portions along at least a portion of a side surface of the side member;
    a display module exposed through the front plate;
    at least one wireless communication circuit electrically connected with the conductive portion;
    a printed circuit board (PCB) positioned between the display module and the back plate; and
    a camera assembly mounted on the PCB such that the camera assembly is interposed between the PCB and the back plate while exposed through a portion of the back plate, wherein the camera assembly includes:
    an image sensor mounted on the PCB;
    a plurality of lenses stacked over one another between the image sensor and the portion of the back plate;
    a barrel positioned between the PCB and the back plate while laterally surrounding the plurality of lenses;
    a camera bracket positioned between the PCB and the back plate while laterally surrounding at least part of the barrel;
    a metal case positioned between the PCB and the back plate while laterally surrounding at least part of the camera assembly; and
    a shielding structure interposed between the camera bracket and the metal case while being spaced from the metal case.

2. The electronic device of claim 1, wherein the metal case is electrically separated from the printed circuit board.

3. The electronic device of claim 2, wherein the shielding structure is electrically connected with the printed circuit board.

4. The electronic device of claim 1, wherein the camera assembly further includes a magnetic component in the camera bracket, and wherein a portion of the shielding structure is interposed between the magnetic component and the metal case.

5. The electronic device of claim 4, wherein the camera assembly further includes a flexible circuit board interposed between the camera bracket and the shielding structure.

6. The electronic device of claim 4, wherein the magnetic component is configured to provide an automatic focusing and/or optical image stabilization (OIS) function.

7. The electronic device of claim 6, wherein the camera assembly further includes a coil interposed between the magnetic component and the shielding structure.

8. The electronic device of claim 1, wherein the metal case includes stainless steel (SUS).

9. The electronic device of claim 1, wherein the wireless communication circuit is configured to transmit and/or receive a signal in a frequency range between 700 MHz to 1000 MHz.

10. The electronic device of claim 1, wherein the shielding structure has a first surface that faces a flexible circuit board to surround an outer surface of the camera bracket and a second surface that is spaced apart from the metal case at a predetermined gap.

11. The electronic device of claim 10, wherein the camera assembly is configured to form an alternating current (AC) ground by producing a coupling capacitance between the metal case and the shielding structure that are spaced apart from each other at the predetermined gap.

12. The electronic device of claim 10, wherein the shielding structure includes:
- a first shielding member surrounding an outer surface of the camera bracket and spaced apart from a side surface of the metal case; and
- a second shielding member disposed on at least a portion of an upper surface of the metal case.

13. The electronic device of claim 12, wherein the second shielding member is shaped to surround the barrel and an opening of the metal case.

14. The electronic device of claim 10, wherein the shielding structure includes:
- a first shielding member surrounding an outer surface of the camera bracket and spaced apart from a side surface of the metal case; and
- a second shielding member extending from the first shielding member and spaced apart from, and facing, at least a portion of an upper surface of the metal case.

15. The electronic device of claim 13, wherein the first shielding member and the second shielding member are arranged to be perpendicular to each other.

16. An electronic device comprising:
- a camera assembly, the camera assembly facing a rear side of the electronic device, and where the camera assembly comprises:
  - an image sensor disposed on a printed circuit board;
  - a lens module exposed through an opening formed on a rear surface of the electronic device and including a plurality of lenses;
  - a camera bracket at least partially surrounding a side surface of the lens module and configured to protect the lens module;
  - a flexible circuit board at least partially surrounding an outer surface of the camera bracket and contacting the printed circuit board;
  - a metal case at least partially surrounding an outer surface of the lens module and the camera bracket and configured to shield off an electromagnetic wave radiated from an inside of the camera assembly; and
  - a shielding structure disposed between the flexible circuit board and the metal case and spaced apart from a side surface of the metal case.

17. The electronic device of claim 16, wherein the camera assembly is configured to form an AC ground by producing a coupling capacitance between the metal case and the shielding structure that are spaced apart from each other at a predetermined gap.

18. The electronic device of claim 17, wherein the camera assembly includes dual-camera.

19. The electronic device of claim 17, wherein the shielding structure includes:
- a first shielding member surrounding an outer surface of the camera bracket and spaced apart from a side surface of the metal case; and
- a second shielding member extending from the first shielding member and spaced apart from, and facing, at least a portion of an upper surface of the metal case.

20. The electronic device of claim 19, wherein a surface of the first shielding member is perpendicular to a surface of the second shielding member.

* * * * *